United States Patent [19]

Short

[11] Patent Number: 4,589,057
[45] Date of Patent: May 13, 1986

[54] COOLING AND POWER AND/OR GROUND DISTRIBUTION SYSTEM FOR INTEGRATED CIRCUITS

[75] Inventor: W. Harry Short, Mesa, Ariz.

[73] Assignee: Rogers Corporation, Rogers, Conn.

[21] Appl. No.: 633,589

[22] Filed: Jul. 23, 1984

[51] Int. Cl.⁴ ............................................... H05K 7/20
[52] U.S. Cl. .................................. 361/386; 361/388;
361/407; 361/385
[58] Field of Search ................. 339/17 CF; 174/15 R,
174/16 HS; 361/385–388, 400, 403, 404, 407,
408, 411, 413, 414, 416

[56] References Cited

U.S. PATENT DOCUMENTS

| | | | |
|---|---|---|---|
| 3,395,318 | 7/1968 | Laemer | 361/386 |
| 3,743,890 | 7/1973 | New | 361/416 |
| 3,818,279 | 6/1974 | Seeger, Jr. | 361/411 |
| 3,885,173 | 5/1975 | Lee | 361/411 |
| 4,245,273 | 1/1981 | Feinberg | 361/385 |
| 4,439,815 | 3/1984 | Close | 361/386 |

Primary Examiner—G. P. Tolin
Attorney, Agent, or Firm—Fishman & Dionne

[57] ABSTRACT

A cooling and a power distribution system for integrated circuits is presented comprising a thermally conducting, preferably metal plate having power distributing buss bars embedded therein. The plate further has thermally conductive and electrically conductive elastomeric material selectively attached thereto. The electrically conductive material being directly connected to the buss bars. The cooling and power distribution plate will then attach via its top and/or bottom surfaces to a printed wiring board having integrated circuits and other electronic components thereon. The thermally conductive elastomers conform over, and to some extent, around the tops of the IC's so as to dissipate heat generated by the IC's during operation. Similarly, the electrically conductive elastomers will provide power and/or ground connection to predetermined points on the printed wiring board and IC's. Preferably, a liquid coolant is circulated through coring provided in the thermally conductive plate.

18 Claims, 10 Drawing Figures

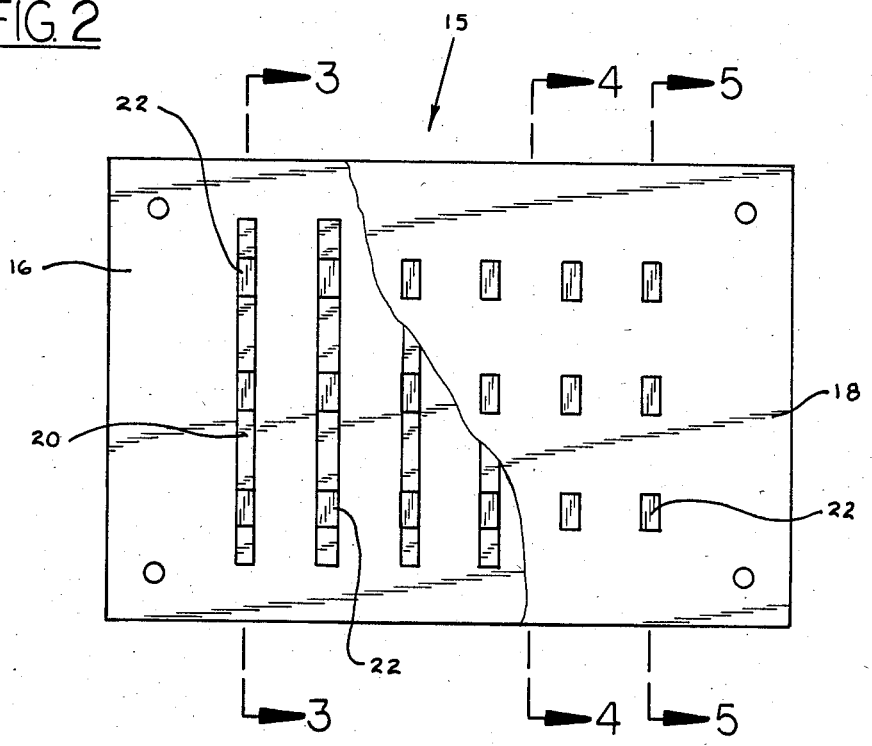

4,589,057

COOLING AND POWER AND/OR GROUND DISTRIBUTION SYSTEM FOR INTEGRATED CIRCUITS

BACKGROUND OF THE INVENTION

This invention relates to a cooling and power distribution system for integrated circuits mounted on a printed wiring board. More particularly, this invention relates to a new and improved integrated circuit cooling and power distribution system comprised of both thermally conductive and electrically conductive elastomeric materials attached to a metal plate having buss bars embedded therein and having the capability to be cooled by an internally circulating coolant.

Integrated circuits (IC's) and other electronic components mounted on a printed wiring board (pwb) in an electronic device produce a great deal of heat during use. The heat produced thereby may cause damage to the electronic device and is obviously undesirable. Prior art heat transfer devices are known which act to remove the excessive heat produced by the integrated circuits and other components. However, these prior art heat transfer systems suffer from a variety of deficiencies and drawbacks. A chief problem of such cooling systems is difficulty in assembly and disassembly. Prior art cooling systems often involve solder, metal or welded joints which may create increased labor and material costs during both assembly and disassembly.

Another difficult problem which is generally associated with integrated circuits and other electronic components mounted on a printed wiring board is one of space on the pwb. Thus, it is well known that as electronic technology advances, there is a critical needed for small components along with optimism utilization or printed wiring board real estate.

SUMMARY OF THE INVENTION

The above-discussed and other problems of the prior art are overcome or alleviated by the cooling and power distribution system for integrated circuits of the present invention. In accordance with the present invention, a thermally conducting, preferably metal plate is provided having power distributing buss bars embedded therein. The plate further has thermally conductive and electrically conductive elastomic material selectively attached thereto. The electrically conductive material being directly connected to the buss bars. The cooling and power distribution plate will then attach via its top and/or bottom surfaces to a printed wiring board having integrated circuits and other electronic components thereon. The thermally conductive elastomers conform over, and to some extent, around the tops of the IC's so as to dissipate heat generated by the IC's during operation. Similarly, the electrically conductive elastomers will provide power and/or ground connection to predetermined points on the printed wiring board and IC's. Preferably, a liquid coolant is circulated through coring provided in the thermally conductive plate.

Thus, the present invention provides a plate which connects to both integrated circuits (and other electronic components) for cooling and the printed wiring board, for power and ground distribution, using selectively located thermally and electrically conductive elastomers which result in all compression interconnects for electrical power and ground distribution, and thermal dissipation. The resulting of cooling and power distribution plate of the present invention can be easily assembled and disassembled without soldering or desoldering. Accordingly, the present invention provides ease of assembly/disassembly initially, after testing and during field maintenance. Moreover, by locating the power and ground sources, i.e., buss bars, in the cooling plate instead of the pwb, essential space i.e., real estate is saved on the pwb.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGS.:

FIG. 2 is a plan view, partly broken, away of a cooling and power distribution plate in accordance with the present invention.

DESCRIPTION OF THE PREFERRED EMBODIMENT

Figure 1A:
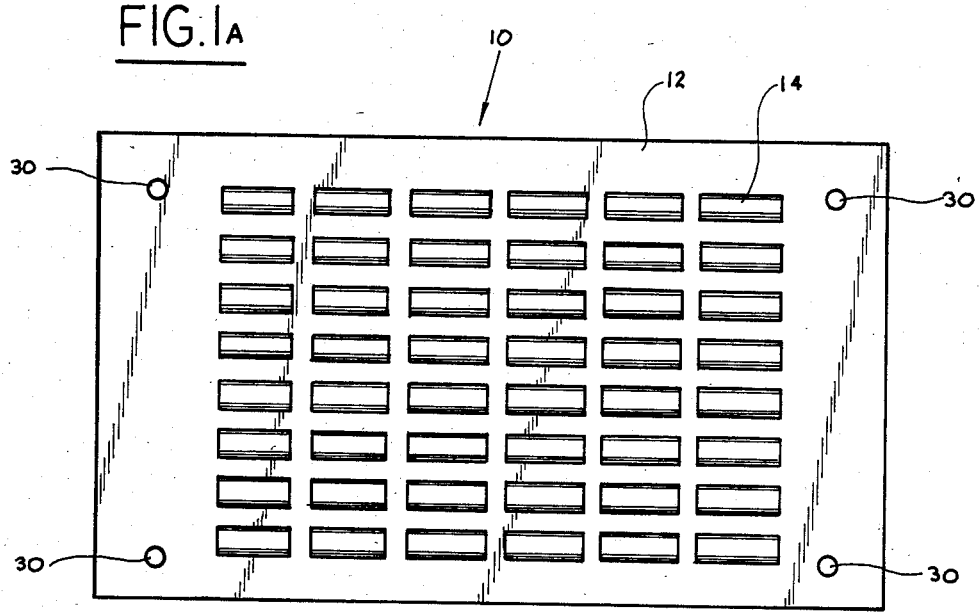
FIG. 1A is a plan view of a printed wiring board (pwb) loaded with integrated circuits.
Figure 1B:
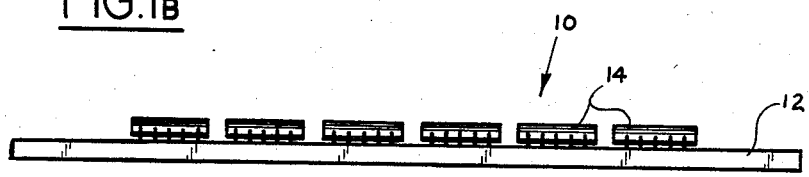
FIG. 1B is a side elevation view of the pwb of FIG. 1A.

Referring first to FIGS. 1A and 1B, a printed wiring board (pwb) having a plurality of integrated circuits (IC's) mounted or loaded thereon is shown generally at 10 and is comprised of a board 12 and integrated circuits 14. Loaded pwb 10 is well known in the electronics art. It will be appreciated that while only IC's 14 are shown loaded on pwb 12, other electronic components may also be loaded on pwb 12. As mentioned earlier, during the operation of the IC's 14, a great deal of heat is evolved. This heat may cause damage to the IC's 14 and other electronic components located on board 12. Besides the problems occuring with heat buildup on the pwb 10, another important concern to pwb designs and engineers is in the efficient utilization of pwb real estate. Accordingly, a well known important objective in the electronics art has been and continues to be the more effective use of pwb space.

Figure 3:
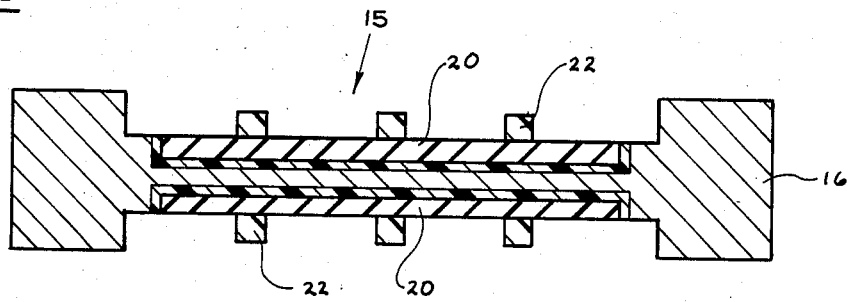
FIG. 3 is a cross-sectional elevation view of the plate of FIG. 2 along the line 3—3.
Figure 4:
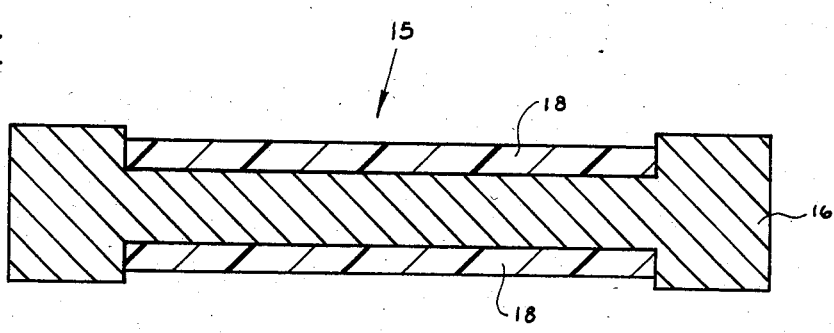
FIG. 4 is a cross-sectional elevation view of the plate of FIG. 2 along the line 4—4.

Referring simultaneously to FIGS. 2-5 the above discussed and other problems of the prior art are overcome by the cooling and power distribution plate 15 of the present invention. In FIGS. 2 and 4, a plate 16, preferably comprised of a highly thermally conductive material such as aluminum is substantially covered on top, bottom or both with a thermally conductive compressive (elastomeric) material 18. The thermally conductive compressive material 18 will transfer heat between the top of the IC's (such as intergrated circuits 14 in FIGS. 1A and 1B) and the plate 16.

Figure 5:
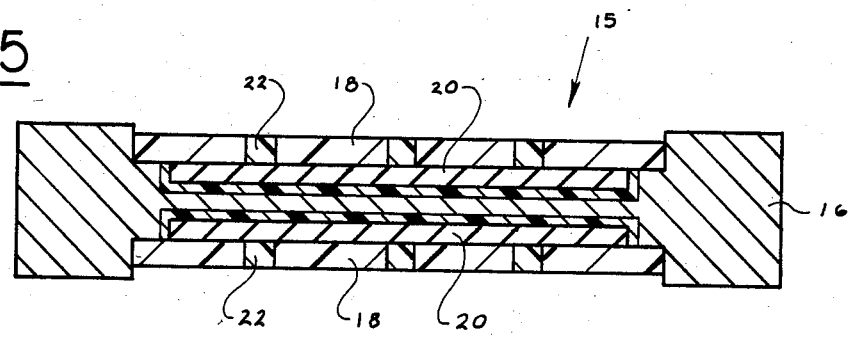
FIG. 5 is a cross-sectional elevation view of the plate of FIG. 2 along the line 5—5.

Plate 16 also includes electrically conductive buss bars 20 which are embedded into the plate, but insulated therefrom via any suitable conventional buss bar insulating technique. These buss bars 20 will provide electrical power and ground to the integrated circuits and other components. Referring now to FIGS. 3 and 5, attached to each buss bar and surrounded by the thermally conductive elastomer 18 are electrically conductive compression points comprised of an electrically conductive elastomeric material 22. These electrically conductive compression points 22 directly connect IC power leads or circuit board pads to the buss bars 20.

Figure 6:
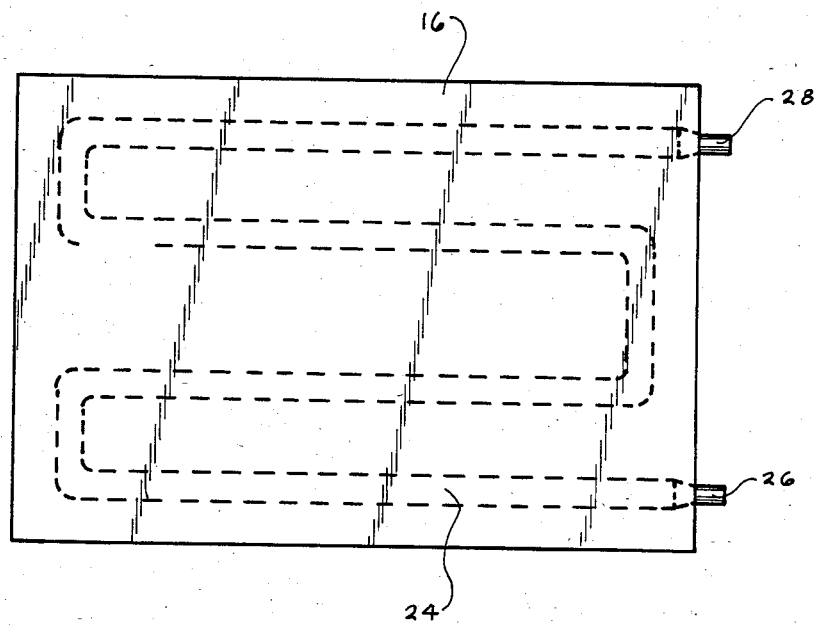
FIG. 6 is a schematic view of the plate of FIG. 2 having coring therein for coolant to flow therethrough.

Referring now to FIG. 6, in a preferred embodiment, cooling and power distribution plate 16 includes coring 24 for passage of liquid coolant so as to increase heat transfer. Coring 24 may be comprised of tubes, pipes, etc. or any other suitable means such as an closed space between the inner and outer surfaces of plate 16. An input port 26 and an output port 28 for connection to a liquid cooling apparatus or other remote heat transfer device are preferred attached to coring 24.

Figure 7:
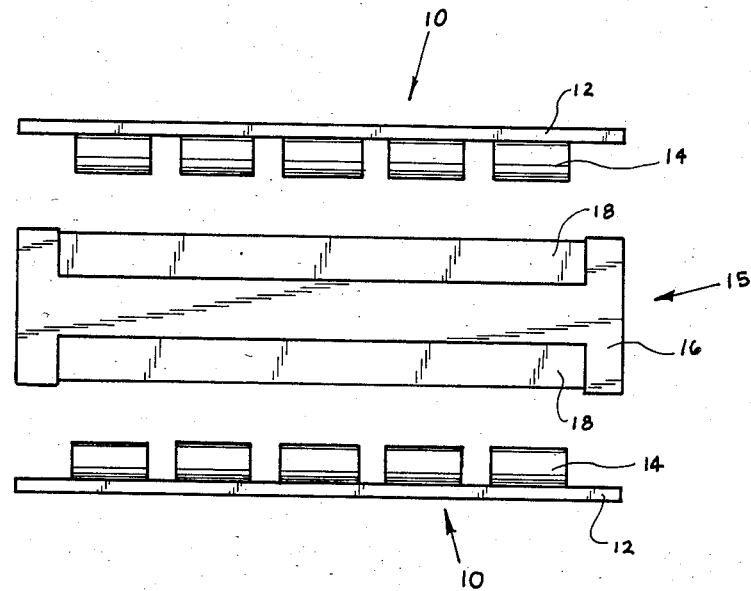
FIG. 7 is a side elevation view of the plate of FIG. 2 prior to the mounting thereon of a pair of the printed wiring boards of FIG. 1.
Figure 8:
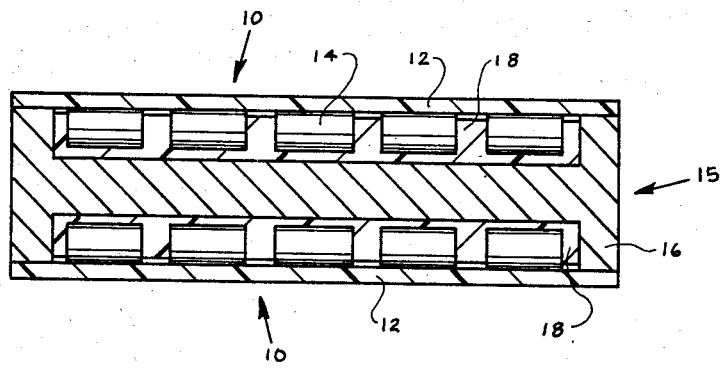
FIG. 8 is a side elevation view showing the assembly of FIG. 7 after the pwb's have been mounted.

In FIG. 7, the cooling and power distribution plate 15 is shown prior to being sandwiched between a pair of printed wiring boards 12 having integrated circuits 14 thereon such as shown in FIGS. 1 and 2. In FIG. 8, the loaded pwb's 10 compressively contact either side of plate 15. Note, that the thermal elastomer 18 substantially conforms to the shape of the IC's. Thus, elastomer 18 intimately contacts the top and much of the sides of the IC's 14. As discussed, this intimate contact allows heat transfer from the IC's 14 through the elastomer 18 to the cooling plate 16. It will be appreciated that the thermal and electrical connection points on plate 15 will exactly match or mirror the corresponding points on the IC board assembly. The cooling plate 15 will therefore provide electrical power distribution and ground to IC's as well as dissipating heat generated by the IC's during operation. Thus, the cooling and power distribution plates of the present invention can be designed for individual IC boards (like memory boards) with predetermined board and IC surfaces, power and ground connections, heights and locations. The IC boards may be mechanically attached to the plate 16 using location holes (such as the holes 30 in FIG. 1) or location posts with little or no individual connecting of thermal or electrical contacts between the loaded IC board 10 and the plate 15.

It will be understood that the cooling and power distribution plate 15 can be designed to attach either to one or two (FIGS. 7 and 8) printed wiring boards as the plate 15 has two opposite sides or surfaces.

It will also be appreciated that the present invention can include variations depending upon the particular IC board to be cooled and supplied with power. Thus, plate 15 may be used as a ground. Also, the buss bars may provide a single voltage or more than one buss bar may provide plural voltages for power or ground. Input/output electrical interconnection to plate 15 may be effected by cables or other power distribution elements which are connected to the power sources. Note that loaded pwb board 10 and cooling plate 15 of FIG. 8 can still be a accessed for other electrical connections, i.e., signal power, from the edges and bottom of each IC board 10.

Figure 9:
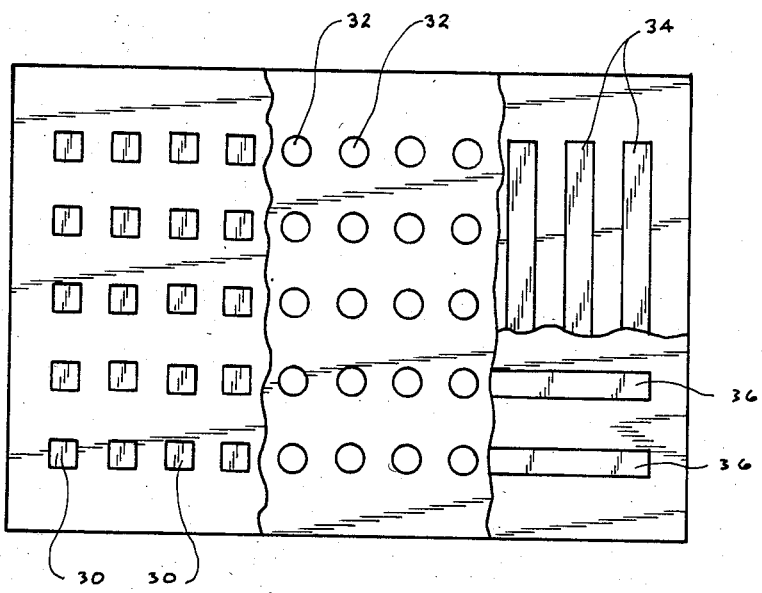
FIG. 9 is a plan view showing four distinct configurations of the electrically conductive elastomer used on the plate of FIG. 2.

Still further variations of the present invention are shown in FIG. 9 wherein a plurality of electrically conductive shaped elastomers are shown. Accordingly, the electrically conductive elastomer may be cubed shaped as shown at 30 or may consist of cylindrical shaped elastomers 32 or vertical and/or horizontal strips as shown at 34 and 36, respectively. It will be appreciated that the electrically conductive elastomer may consist of any other suitable shape and so may be individually tailored for any application.

Thus, the present invention provides a plate which connects to both integrated circuit (and other electronic components) for cooling and the printed wiring board, for power and ground distribution, using selectively located thermally and electrically conductive elastomers which result in all compression interconnects for electrical power and ground distribution and thermal dissipation. The cooling and power and distribution plate of the present invention can be easily assembled and disassembled without soldering or desoldering. Accordingly, the present invention provides ease of assembly/disassembly initially, after testing and during field maintenance. Moreover, by locating the power and ground sources, i.e., buss bars in the cooling plate instead of the pwb, essential space i.e., real estate is saved on the pwb.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A cooling and power and/or ground distribution system for printed wiring elements having at least one electronic component thereon comprising:
   thermally conductive metal plate means, said plate means having two opposed side surfaces;
   discreet power and/or ground distribution buss bar means being attached to at least one of said opposed sides of said plate means, but being electrically insulated thereform;
   thermally conductive elastomeric material being attached to at least a portion of at least one opposed side of said plate means, said thermally conductive elastomeric material being selectively disposed over at least a first portion of said discreet buss bar means;
   electrically conductive elastomeric material being selectively disposed over at least a second portion of said discreet buss bar means and being mechanically and electrically attached thereto;
   said electrically conductive elastomeric material defining a plurality of distinct elements, said distinct elements being separated from each other by said thermally conductive elastomeric material;
   said discreet buss bar means being sandwiched between said conductive metal plate means and said thermally and electrically conductive elastomeric materials, said discreet bus bar means being fully surrounded by said plate means and said elastomeric materials.

2. The system of claim 1 wherein:
   said metal is aluminum.

3. The system of claim 1 wherein said plate means includes:
   coring for the internal transport of liquid coolant.

4. The system of claim 3 wherein said coring includes:
   at least one input port; and
   at least one output port.

5. The system of claim 1 including:
means for removably attaching at least one opposed side of said plate means to at least one printed wiring element having at least one electronic component thereon.

6. The system of claim 5 wherein said attaching means includes:
locating holes or posts in said plate means.

7. The system of claim 1 wherein:
said electrically conductive elastomeric material has a shape selected so as to effect connection to said electronic component.

8. The system of claim 7 wherein said shape is selected from the group consisting of:
cubes, cylinders or strips.

9. A cooling and power and/or ground distribution system for printed wiring elements having at least one electronic component thereon comprising:
thermally conductive metal plate means, said plate means having two opposed side surfaces;
discreet power and/or ground distribution buss bar means being attached to at least one of said opposed sides of said plate means, but being electrically insulated therefrom;
thermally conductive elastomeric material being attached to at least a portion of at least one opposed side of said plate means, and thermally conductive elastomeric material being selectively disposed over at least a first portion of said discreet buss bar means;
electrically conductive elastomeric material being selectively disposed over at least a second portion of said discreet buss bar means and being mechanically and electrically attached thereto;
said electrically conductive elastomeric material defining a plurality of distinct elements, said distinct elements being separated from each other by said thermally conductive elastomeric material;
said discreet buss bar means being sandwiched between said conductive metal plate means and said thermally and electrically conductive elastomeric materials, said discreet buss bar means being fully surrounded by said plate means and said elastomeric materials;
at least one printed wiring element having at least one electronic component thereon, said printed wiring element being removably attached to at least one opposed side of said plate means; and
said plate means including means for effecting said removable attachment of said printed wiring element thereto.

10. The system of claim 9 wherein:
said metal is aluminum.

11. The system of claim 9 wherein said plate means includes:
coring for the internal transport of liquid coolant.

12. The system of claim 11 wherein said coring includes:
at least one input port;
and at least one output port.

13. The system of claim 9 wherein said attaching means includes:
locating holes or posts in said plate means.

14. The system of claim 9 wherein said electrically conductive elastomeric material has a shape selected so as to effect connection to said electronic component.

15. The system of claim 14 wherein said shape is selected from the group consisting of:
cubes, cylinders or strips.

16. The system of claim 11 wherein:
said electronic component comprises at least one integrated circuit.

17. The system of claim 1 wherein:
said discreet buss bar means are at least partially embedded in said thermally conductive plate means.

18. The system of claim 11 wherein:
said discreet buss bar means are at least partially embedded in said thermally conductive plate means.

* * * * *